(12) United States Patent
Okada

(10) Patent No.: US 6,980,054 B2
(45) Date of Patent: Dec. 27, 2005

(54) TRANS-CONDUCTANCE AMPLIFICATION CIRCUIT, TRANS-CONDUCTANCE FILTER CIRCUIT, AND FILTERING METHOD

(75) Inventor: Kouji Okada, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 10/379,896

(22) Filed: Mar. 6, 2003

(65) Prior Publication Data

US 2003/0189462 A1  Oct. 9, 2003

(30) Foreign Application Priority Data

Apr. 5, 2002 (JP) ............................. 2002-104108

(51) Int. Cl.[7] ................................................ H03F 3/45
(52) U.S. Cl. .......................................... 330/257; 330/51
(58) Field of Search ............................... 330/257, 252, 330/303, 51

(56) References Cited

U.S. PATENT DOCUMENTS

| 5,563,819 | A | * | 10/1996 | Nelson | 708/819 |
| 5,666,086 | A | * | 9/1997 | Klein | 330/253 |
| 6,201,379 | B1 | * | 3/2001 | MacQuigg et al. | 323/313 |
| 6,531,921 | B2 | * | 3/2003 | Horie | 330/255 |
| 6,741,130 | B2 | * | 5/2004 | Wey et al. | 330/253 |

* cited by examiner

Primary Examiner—Patricia Nguyen
(74) Attorney, Agent, or Firm—Arent Fox PLLC

(57) ABSTRACT

A trans-conductance filter circuit with an expanded cut-off frequency range is provided. The cut-off frequency of a trans-conductance filter circuit is changed by varying the current mirror ratio of a current mirror circuit. This mirror ratio is varied by changing the output current of a constant current source, or by switching among the respective action states of multiple transistors the actions of which are invoked within constant current regions. The variable cut-off frequency range can be expanded without losing the constant current attributes of the transistors.

31 Claims, 11 Drawing Sheets

FIG. 10.1

| Multiplication ratio of gm value | $S_1$ signal | $S_2$ signal |
|---|---|---|
| Single | ON | OFF |
| Double | ON | ON |

FIG. 10.2

TRANS-CONDUCTANCE AMPLIFICATION CIRCUIT, TRANS-CONDUCTANCE FILTER CIRCUIT, AND FILTERING METHOD

BACKGROUND OF THE INVENTION

1. Field of the Invention

The present invention concerns a filter circuit which is used for optical and/or magnetic recording devices such as communications equipment, audio machines, or HDD·MO, etc.

2. Description of the Related Art

Filter circuits are used in communications equipment or audio machines for selecting a specified frequency and removing noise. A low pass filter, for example, transmits low-band frequency signals. A high pass filter transmits high-band frequency signals. And a band pass filter transmits frequency signals within a specified frequency range.

In recent years, electronic appliances must meet high precision demands, and filter circuits used in electronic circuits mounted on these electronic appliances are no exception. These filter circuits must also function effectively over a wider frequency range. The wide frequency range requirement, in particular, has become more demanding for electronic appliances and their filter circuits. Thus, a filter circuit which operates over a wide frequency range while maintaining high precision has become necessary.

FIG. 1 shows a trans-conductance filter circuit (gm filter circuit) used for a trans-conductance amplification circuit (gm amplification circuit). The gm filter circuit is formed by a first transistor 1 and a second transistor, which receive differential input signals. Three constant current sources 3, 4, and 5 are connected to the first transistor 1 and the second transistor 2. A pair of capacitors 6 and 7 are connected to differential output terminal.

The cut-off frequency fc of the gm filter circuit is expressed by formula 1:

$$fc = gm/(2\pi C) \quad (1)$$

where $gm = \Delta i/\Delta V$, and where gm=Mutual conductance; C=Capacitance; $\Delta i$=The variation in current magnitude; $\Delta V$=The variation in voltage magnitude.

In the context of realizing the wide frequency range objective in an electronic appliance, it is necessary to vary the cut-off frequency of its gm filter circuit. The following two methods are used for varying the cut-off frequency. First, the current provided to the gm filter circuit may be varied. Second a variable resistor may be inserted in the gm circuit between the transistors as shown in FIG. 4.

First, the current provided to the gm filter circuit may be varied. FIG. 2 shows varying the current values of the constant current sources of the filter circuit. FIG. 3 shows the relationship between the drain current (Vd) and mutual conductance (gm) of a MOS transistor. In this figure, gm bears an attribute proportional to the square root of Vd. gm increases as the current value (Vd) increases. As shown by formula (1), the cut-off frequency also increases as gm increases. As the current value (Vd) decreases, both gm and the cut-off frequency decreases.

Second, a variable resistance may be inserted into the gm filter circuit. FIG. 4 shows inserting a variable resistance between the respective sources of a first transistor 15 and a second transistor 16, which receive the differential input signal for the filter circuit. A variation of gm is induced by varying the resistance, and the cut-off frequency is accordingly varied. As the resistance value increases, the variation in current magnitude $\Delta i$ decreases. When the variation in current magnitude decreases, gm also decreases. As a result the cut-off frequency is lowered. As the resistance value decreases, the magnitude of the current variation ($\Delta i$) increases. As a result, gm and the cut-off frequency increase.

These methods for varying cut-off frequencies, however, have problems. For example, a constant current source may be formed from a transistor used within a constant current region. An effort to vary the cut-off frequency, however, may result in the transistor operating outside this region.

A general relationship between the source-drain voltage (Vds) and source-drain current (Ids) of a transistor is shown in FIG. 5. In this figure, the tripolar tube region I (resistant region) signifies a region over which an Ids variation dovetails a Vds variation. The pentapolar tube region II (constant current region) signifies a region over which virtually no Ids variation is incurred despite a Vds variation. The constant current source is predicated on the use of the pentapolar tube region II (constant current region) of the transistor.

When the cut-off frequency variation is small, only a small current variation is required. This operating condition is shown by the range of curves a, b, and c in FIG. 5. The existence of a pentapolar tube region can be found and constant current feature can be used for the transistor.

When the cut-off frequency is raised, a larger current value is required. This operating condition is shown by curve d in FIG. 5. No pentapolar tube region or only a narrow pentapolar tube region exists at this operating condition. Thus, at this operating condition, the constant current feature cannot be used for the transistor. Consequently, it is impossible to provide normal actions of the gm circuit requiring a constant current source. From the standpoint of securing the normal action of the gm filter circuit (i.e., securing the constant current attribute for the transistor), the magnitude of the current variation is limited. Consequently, the range of the cut-off frequency variation is also limited.

The current mirror circuit shown in FIG. 6 is one example of a constant current source. FIG. 7 illustrates a second example of a constant current source. The transistors (27) and (29) are vertically stacked for improving the constant current feature.

FIG. 8 illustrates a gm filter circuit that uses a current mirror circuit as a constant current source. In this mirror circuit, the transistors (35), (37), (39), (42), and (44) are stacked vertically in relation to the gm filter circuit of FIG. 1. These vertically stacked transistors improve the ability of the circuit to provide a constant current. They are problematic, however, in that they reduce the output signal amplitude. This amplitude reduction is a grave problem where minimizing the electric power consumptions of electronic circuits is a priority.

When a large range in the cut-off frequency is required, it is necessary to induce a significant variation of the resistance value of the variable resistance. When the variable resistance value is large or becomes large, however, the differential circuit function becomes lost, and the circuit performance becomes equivalent to a circuit having two inputs and one output. It also becomes impossible to exploit the advantages of the differential circuit such as its advanced power source variation and noise resistance. Thus, the resistance value cannot be adjusted to a large value from the standpoint of preserving the differential circuit performance, and the range for the cut-off frequency is limited.

Thus, the second method, wherein a variable resistance is inserted into the gm filter circuit places limits on the range of the cut-off frequency. Similarly, the first method, wherein the current through the gm filter circuit is varied, also places limits on the range of the cut-off frequency. The amplitude reduction of the output voltage when using vertically stacked transistors exists as another problem.

SUMMARY OF THE INVENTION

In order to solve these problems, the present invention provides a trans-conductance amplification circuit that includes a differential signal input unit. A first current mirror circuit is connected to the differential signal input unit. The first current minor circuit switches between a first current mirror ratio and a second current mirror ratio. A second current mirror circuit is connected to the differential signal input unit. The second current mirror circuit switches between the first current mirror ratio and the second current mirror ratio.

The present invention also provides a trans-conductance amplification circuit that includes a signal input unit. A current mirror circuit is connected to the signal input unit. The current mirror circuit switches and outputs a first output current and a second output current. A switch control circuit controls the switch circuit.

The present invention also provides a trans-conductance filter circuit that includes an amplification circuit which outputs a first output current by triggering the action of a first transistor within a constant current region based on a first control signal and which outputs a second output current by triggering the respective actions of the first transistor and a second transistor within a constant current region based on a second control signal and a cut-off frequency generation circuit which is connected to the amplification circuit and which generates a cut-off frequency for an input signal based on the first output current and the second output current.

The following effects can be achieved by the trans-conductance amplification circuit and trans-conductance filter circuit of the present invention: (1) the cut-off frequency range can be broadened; (2) the output voltage amplitude reduction can be avoided; and (3) the advantages of differential circuit such as advanced power source variation and noise resistance can be exploited.

The cut-off frequency range can be broadened by switching the current mirror output current magnitude between alt least a first and second magnitude.

As far as the present invention is concerned, the first current mirror ratio and second current mirror ratio can be switched and changed with regard to the first current mirror circuit and second current mirror circuit. In other words, in a case where the current mirror ratios of the first current mirror circuit and second current mirror circuit are varied, the cut-off frequency can be significantly varied while the transistor constant current function is maintained.

Similarly, the first output current and second output current can be switched and outputted with regard to the first current mirror circuit and second current mirror circuit. In other words, in a case where output currents outputted by the first current mirror circuit and second current mirror circuit are varied, the cut-off frequency can be significantly varied while maintaining the transistor's constant current function.

The respective actions of the first transistor and second transistor can also be used within the constant current region while being mutually switched. In other words, in a case where the respective actions of the first transistor and second transistor are varied within the constant current region, the cut-off frequency can be significantly varied while maintaining the constant current attribute for the transistor.

The output voltage amplitude reduction can be avoided by reducing or eliminating the need for stacked transistors.

The advantages of differential circuit such as advanced power source variation and noise resistance can be exploited.

A trans-conductance amplification circuit is provided that includes a differential input signal unit. A first current mirror circuit is connected to the differential input signal unit. The first mirror circuit switches between a first current mirror ratio and a second current mirror ratio. A second current mirror circuit is also connected to the differential input signal unit and also switches between the first current mirror ratio and the second current mirror ratio.

The trans-conductance amplification circuit described above that includes a switch control circuit controling the switching between the first current mirror ratio and the second current mirror ratio.

The trans-conductance amplification circuit described above wherein the switch control circuit includes at least one member selected from among registers, microcomputers, and memories.

The trans-conductance amplification circuit wherein vertically stacked transistors are connected to the first trans-conductance amplification circuit and the second current mirror circuit.

The trans-conductance amplification circuit wherein the first current mirror circuit and the second current mirror circuit each include variable current sources or constant current sources.

A trans-conductance filter circuit including the trans-conductance amplification circuit described above.

A trans-conductance amplification circuit including a differential input signal unit. A first current mirror circuit connected to the differential input signal unit. A second current mirror circuit connected to the differential input signal unit. At least one of the first current mirror circuit and second current mirror circuit includes a switch circuit which switches the output between a first output current and a second output current.

The trans-conductance amplification circuit further including a switch control circuit which controls the switch circuit.

The trans-conductance amplification circuit wherein the switch control circuit includes at least one member selected from among registers, microcomputers, and memories.

The trans-conductance amplification circuit wherein vertically stacked transistors are connected to the first current mirror circuit and the aforementioned second current mirror circuit.

The trans-conductance amplification circuit including one or two output terminals.

The trans-conductance amplification circuit wherein the first current mirror circuit and the second current mirror circuit each include constant current sources or variable current sources.

A trans-conductance filter circuit including the trans-conductance amplification circuit discussed above.

A trans-conductance amplification circuit including a differential input signal unit. A first switch circuit triggers the action of a first transistor within a constant current region based on a first control signal. A second switch circuit triggers the respective actions of the first transistor and a second transistor within a constant current region based on a second control signal.

The trans-conductance amplification circuit further including a switch control circuit which controls the first switch circuit and the second switch circuit.

The trans-conductance amplification circuit wherein the switch control circuit includes at least one member selected from among registers, microcomputers, and memories.

The trans-conductance amplification circuit wherein the first trans-conductance amplification circuit and the second current mirror circuit each include constant current sources or variable current sources.

A trans-conductance filter circuit including the trans-conductance amplification circuit discussed above.

A trans-conductance amplification circuit including a signal input unit. A current mirror circuit is connected to the signal input unit and includes a switch circuit which switches and outputs a first output current and a second output current. A switch control circuit which controls the switch circuit.

The trans-conductance amplification circuit wherein the switch control circuit includes at least one member selected from among registers, microcomputers, and memories.

The trans-conductance amplification circuit wherein vertically stacked transistors are connected to the current mirror circuit.

The trans-conductance amplification circuit including one or two output terminals.

The trans-conductance amplification circuit wherein the current mirror circuit includes a constant current source or variable current source.

A trans-conductance filter circuit including the trans-conductance amplification circuit described above.

A trans-conductance amplification circuit including a signal input unit. A current mirror circuit is connected to the signal input unit. The current mirror circuit includes a switch circuit which is controlled based on a first control signal or second control signal. The current mirror circuit selectively outputs a first output current or second output current based on the action of the switch circuit.

The trans-conductance amplification circuit including a switch control circuit which controls the switch circuit.

The trans-conductance amplification circuit discussed above, wherein the switch control circuit includes at least one member selected from among registers, microcomputers, and memories.

The trans-conductance amplification circuit wherein vertical stacked transistors are connected to the current mirror circuit.

The trans-conductance amplification circuit wherein the current mirror circuit possesses one or two output terminals.

The trans-conductance amplification circuit wherein the current mirror circuit includes a constant current source or variable current source.

A trans-conductance filter circuit including the trans-conductance amplification circuit discussed above.

A trans-conductance filter circuit including an amplification circuit which outputs a first output current by invoking the action of a first transistor within a constant current region based on a first control signal and which outputs a second output current by invoking the respective actions of the first transistor and a second transistor within a constant current region based on a second control signal. A cut-off frequency generation circuit is connected to the amplification circuit and which generates a cut-off frequency in relation to an input signal based on the first output current or the second output current.

The trans-conductance filter circuit discussed above including a switch control circuit which controls the generation of the first output current or the second output current.

The trans-conductance filter circuit wherein the switch control circuit includes at least one member selected from among registers, microcomputers, and memories.

The trans-conductance filter circuit including one or two output terminals.

The trans-conductance filter circuit wherein the amplification circuit includes a constant current source or variable current source.

A filtering method including receiving an input signal. A first current mirror ratio or second current mirror ratio is selected based on a control signal. The input signal is filtered based on a cut-off frequency corresponding to an output current based on the first current mirror ratio or the second current mirror ratio.

A filtering method including receiving input signal. A first output current or second output current is selected based on a control signal. The input signal is filtered based on a cut-off frequency corresponding to the first output current or the second output current.

A filtering method including outputting a first output current by turning ON a first switch circuit based on a first control signal or outputting a second output current by turning ON a second switch circuit based on a second control signal. The input signal is filtered based on a cut-off frequency corresponding to the first output current or the second output current.

A filtering method including outputting a first output current by triggering the action of a first transistor within a constant current region based on a first control signal. A second output current is output by triggering the respective actions of the first transistor and a second transistor within a constant current region based on a second control signal. The cut-off frequency is determined in relation to the input signal based on the first output current or the second output current.

A filtering method including receiving an input signal. The output current is crudely adjusted by selecting a first output current or second output current based on a control signal. The output current is finely adjusted based on the current of a variable current source. The input signal is filtered based on a cut-off frequency corresponding to the output current.

A trans-conductance amplification circuit including a differential signal input unit and a specified number n (n is a positive integer) of current mirror circuits which select the corresponding number n of mutually different current mirror ratios.

A trans-conductance amplification circuit including a differential signal input unit and a specified number n (n is a positive integer) of current mirror circuits. At least one of the number n of current mirror circuits includes multiple switch circuits which are capable of outputting mutually different output currents.

A trans-conductance amplification circuit including a signal input unit, a specified number n (n is a positive integer) of current mirror circuits which possess switch circuits which are capable of switching and outputting mutually different output currents, and a switch control circuit which controls the switch circuits.

A trans-conductance amplification circuit including a trans-conductance amplification circuit having a signal input unit and a specified number n (n is a positive integer) of current mirror circuits, the number n (n is a positive integer) of current mirror circuits each has a switch circuit which is controlled based on a control signal and selectively output multiple mutually different output currents based on the actions of the switch circuits.

DESCRIPTION OF THE INVENTION

Figure 1:
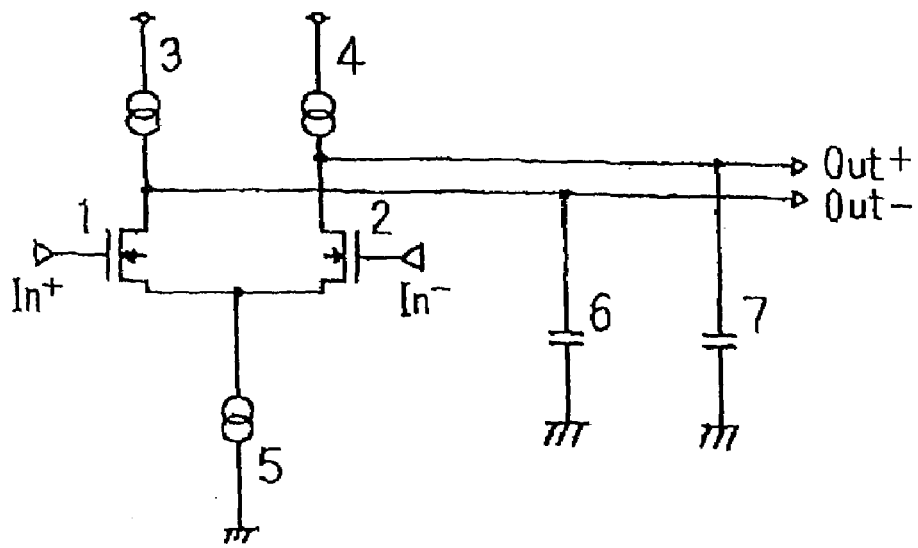
FIG. 1 shows a first gm filter circuit of the prior art.
Figure 2:
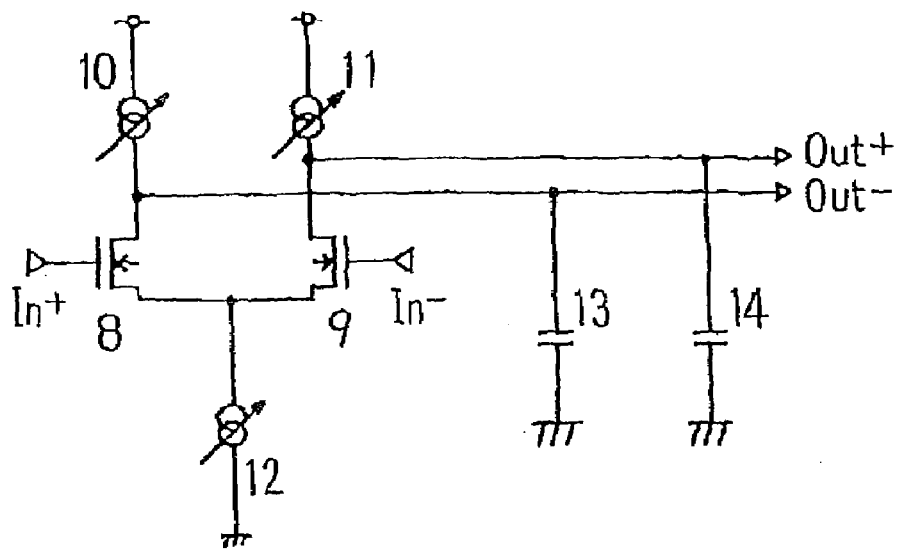
FIG. 2 shows a gm filter circuit which is capable of changing the first cut-off frequency of the prior art.
Figure 3:
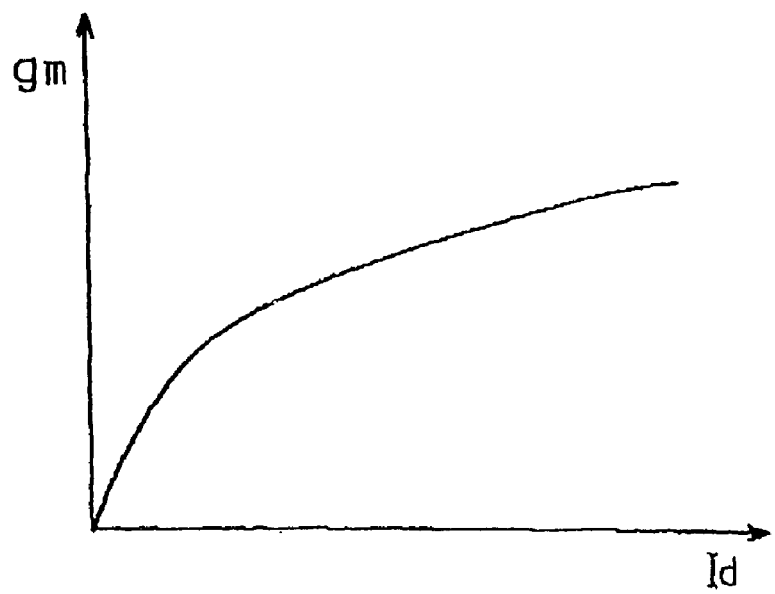
FIG. 3 illustrates the Id-gm profile of a transistor.
Figure 4:
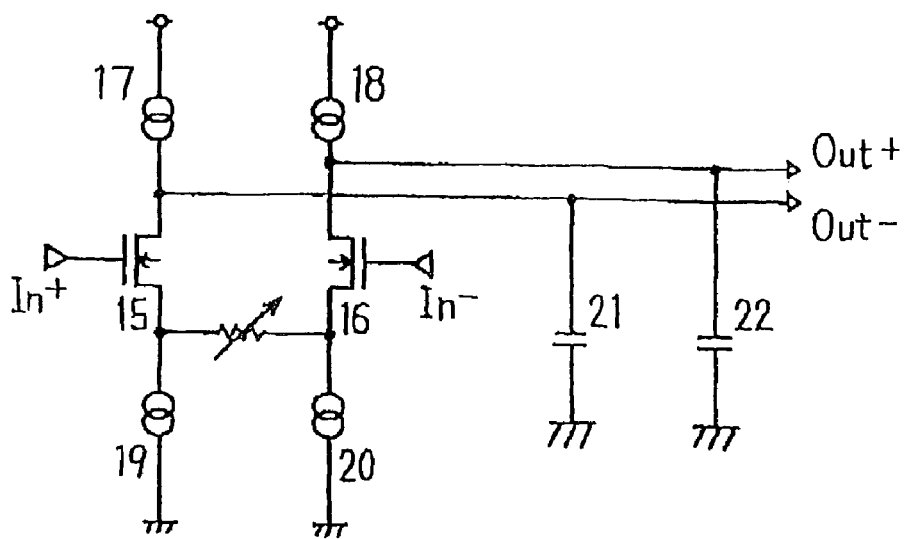
FIG. 4 shows a gm filter circuit which is capable of changing the second cut-off frequency of the prior art.
Figure 5:
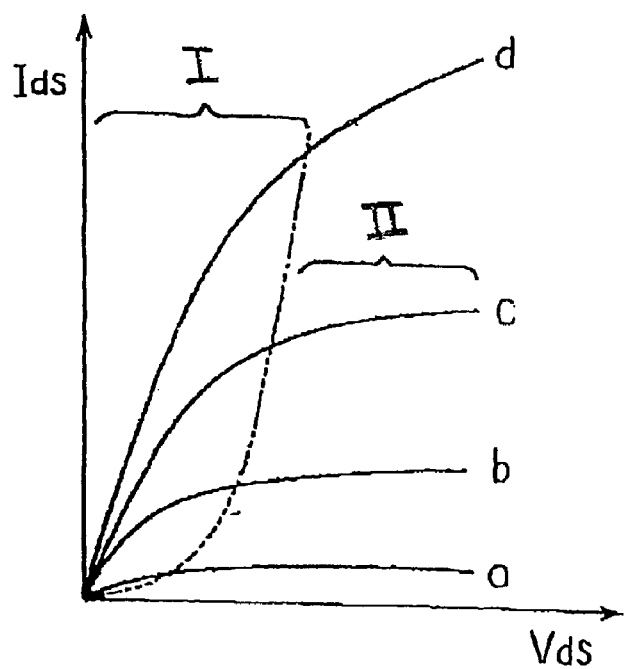
FIG. 5 shows transistor performance.
Figure 6:
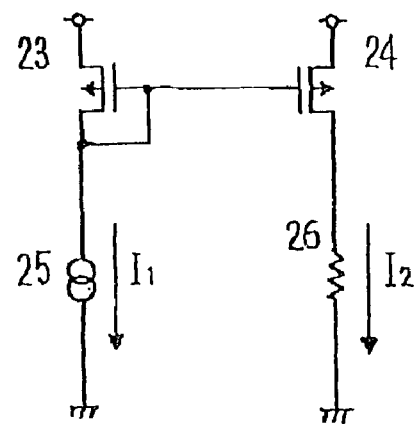
FIG. 6 shows a first constant current circuit of the prior art.
Figure 7:
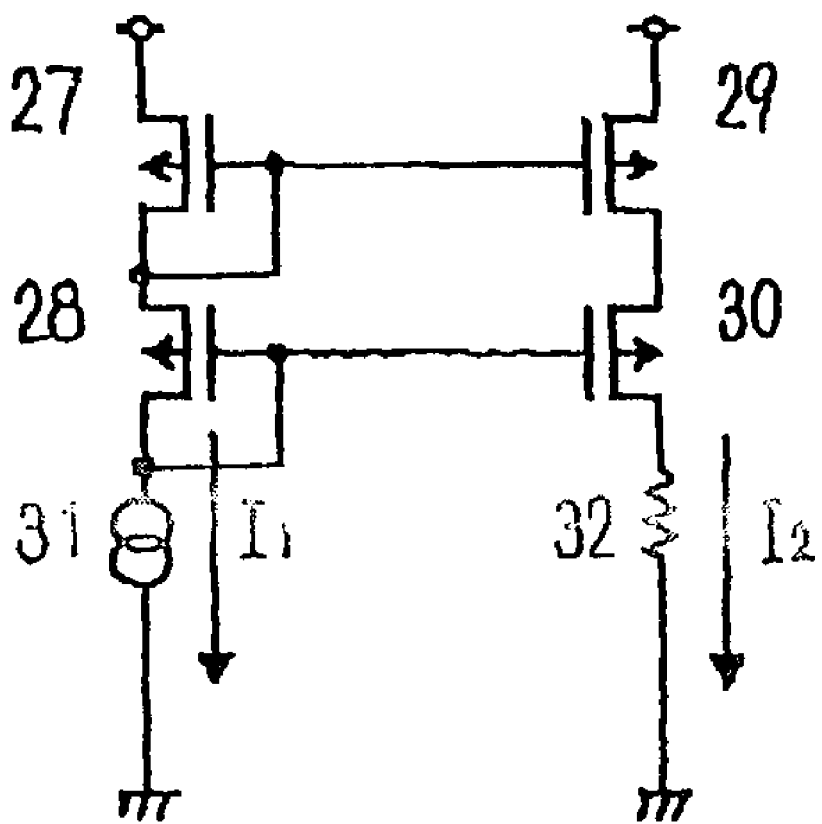
FIG. 7 illustrates a second constant current circuit of the prior art.
Figure 8:
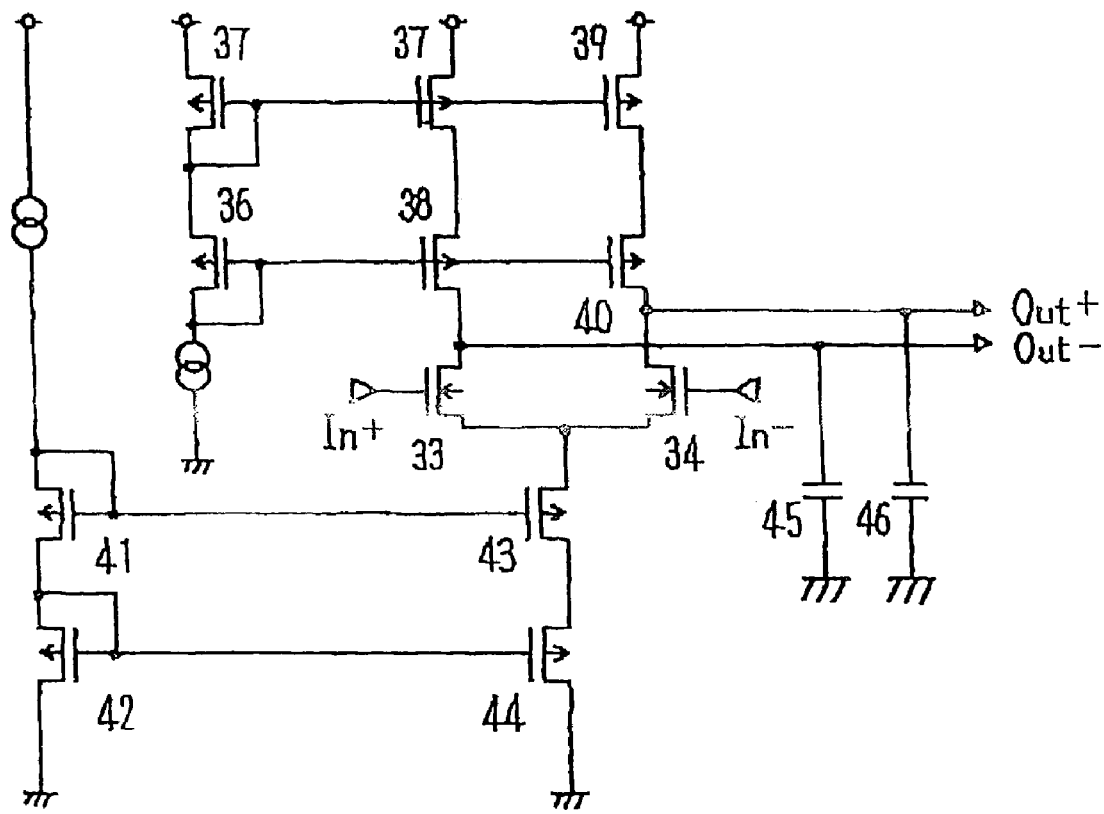
FIG. 8 which shows a second gm filter circuit of the prior art.
Figure 9:
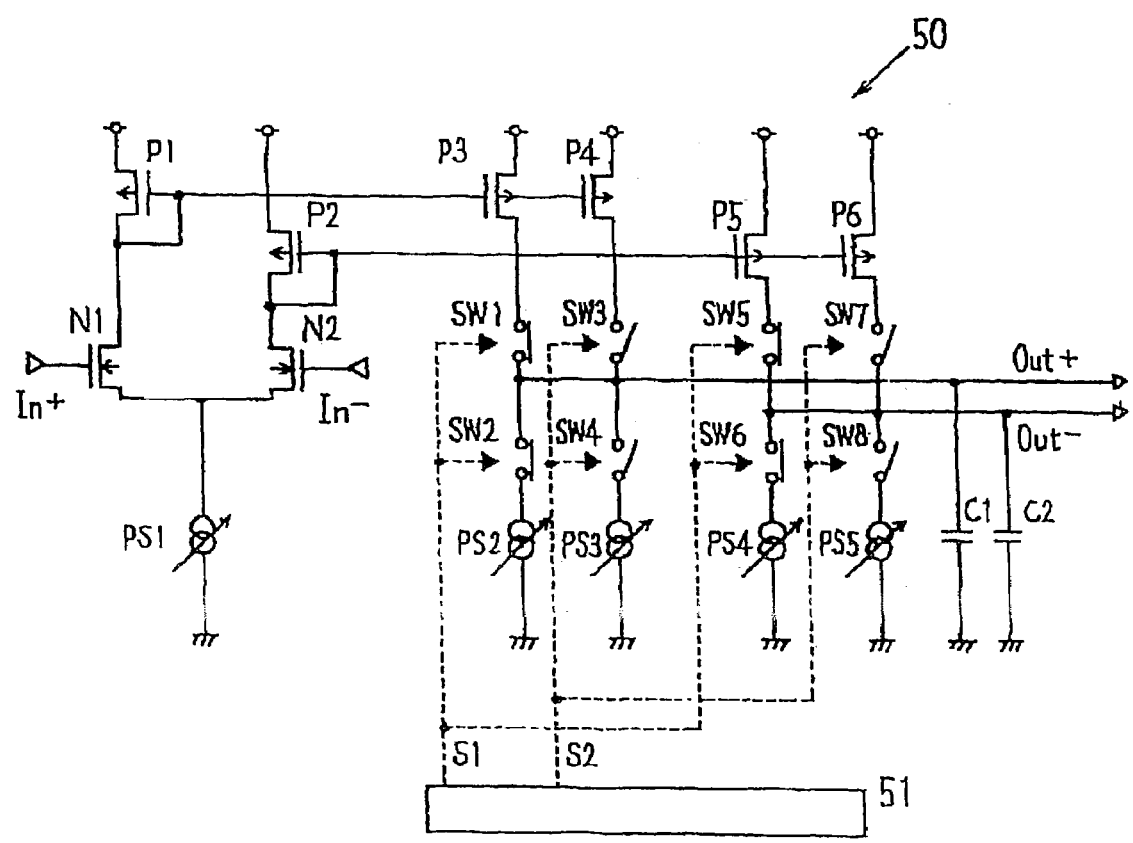
FIG. 9 shows a first example of the present invention.

FIG. 9 shows a first example of the present invention. In this example, the cut-off frequency adjustment range is broadened by maintaining the constant current function for the transistor despite a significant current level variation. In FIG. 9, the gm filter circuit 50 automatically doubles the standard cut-off frequency.

The exemplary gm filter circuit 50 shown in FIG. 9 includes a differential input unit formed by a first N channel transistor N1 and a second N channel transistor N2. A differential input signal is fed into each transistor. A first constant current circuit is formed by a current mirror circuit. This mirror circuit outputs the first differential input signal. A second constant current circuit also is formed by a current mirror circuit. This mirror circuit outputs the second differential output signal. The filter circuit also includes a first variable current source (or constant power source) PS1; a first capacitor C1 and second capacitor C2; and a switch control circuit.

The first current mirror circuit responds to the first differential input signal In+. The first current mirror circuit is formed by a first P channel transistor P1, a third P channel transistor P3, a fourth P channel transistor P4, a first switch SW1, a second switch SW2, a third switch SW3, a fourth switch SW4, a second variable current source (or constant power source) PS2, and a third variable current source (or constant power source) PS3. The first switch SW1 is connected between the third P channel transistor P3 and the output terminal OUT+. The second switch SW2 is connected between the second variable current source PS2 and the output terminal OUT+. The third switch SW3 is connected between the fourth P channel transistor P4 and the output terminal OUT+. And the fourth switch SW4 is connected between the fourth variable current source (or constant power source) PS4 and the output terminal OUT+.

The second current mirror circuit responds to the second differential input signal In−. The second current mirror circuit is formed by a second P channel transistor P2, a fifth P channel transistor P5, a sixth P channel transistor P6, a fifth switch SW5, a sixth switch SW6, a seventh switch SW7, an eighth switch SW8, a fourth variable current source (or constant power source) PS4, and a fifth variable current source (or constant power source) PS5. The fifth switch SW5 is connected between the fifth P channel transistor P5 and the output terminal OUT−. The sixth switch SW6 is connected between the fourth variable current source PS4 and the output terminal OUT−. The seventh switch SW7 is connected between the sixth P channel transistor P6 and the output terminal OUT−. The eighth switch SW8 is connected between the fifth variable current source (or constant power source) PS5 and the output terminal OUT−.

Figure 10:
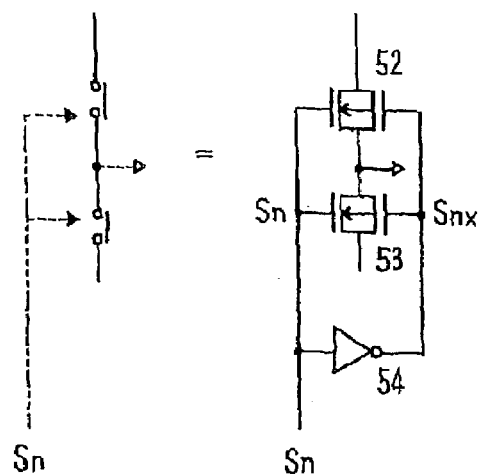
FIGS. 10.1 and 10.2 illustrate switches and switch control contents, respectively.

The transfer gate shown in FIG. 10.1 may, for example, be employed as a switch circuit. The first switch circuit is formed by switch SW1 and switch SW2. The second switch circuit is formed by switch SW3 and switch SW4. The third switch circuit is formed by switch SW5 and switch SW6. The fourth switch circuit is formed by switch SW7 and switch SW8. Each switch circuit shown in FIG. 9 may be formed by the switch circuit shown in FIG. 10.1. The switch circuit in FIG. 10.1 is formed by transfer gates 52 and 53, and inverter 54. The switch circuit, furthermore, is controlled by the control signal Sn obtained from the switch control circuit (or by the control signals S1 and S2 in the case of the switch control circuit 51 shown in FIG. 9).

The current mirror ratios of the first current mirror circuit and the second current mirror circuit can be selected by controlling the first through fourth switch circuits based on the control signals S1 and S2 obtained from the switch control circuit. In response to the selections of the current mirror ratios, the level of the current varies, and the gm (mutual conductance) also varies. A gm variation can therefore be induced by selecting the current mirror ratio. Consequently the cut-off frequency is also varied.

The current mirror ratio of the first current mirror circuit can be designated at 1:1 or 1:2 using the first switch control circuit and the second switch control circuit. The current mirror ratio of the second current mirror circuit can be designated at 1:1 or 1:2 using the third switch control circuit and the fourth switch control circuit.

FIG. 10.2 shows exemplary contents of the control signals. The first control signal S1 is provided to the first switch circuit and third switch circuit. The second control signal S2 is provided to the second switch circuit and fourth switch circuit. In a case where the standard cut-off frequency available by default (1:1, single mode, or mode 1) is selected, the first and third switch circuits are turned ON by the first control signal S1, and the second and fourth switch circuits are turned OFF by the second control signal S2. The respective current mirror ratios of the first current mirror circuit and second current mirror circuit are each designated at 1:1 based on this control protocol. A first output current for generating the standard cut-off frequency is output by the first current mirror circuit and second current mirror circuit. This first output current is generated by the first P channel transistor P1 and third P channel transistor P3 of the first current mirror circuit and the second P channel transistor P3 and fifth P channel transistor P5 of the second current mirror circuit.

In a case where the cut-off frequency is designated at double the standard cut-off frequency (1:2, double mode, or mode 2), the first and third switch circuits are turned ON by the first control signal S1 while the second and fourth switch circuits are also turned ON by the second control signal. The respective current mirror ratios of the first current mirror circuit and second current mirror circuit are each designated at 1:2 based on this control protocol, and the second output current for generating the cut-off frequency which is double the standard cut-off frequency is output by the first current mirror circuit and second current mirror circuit. This second output current is generated by the first P channel transistor P1, third P channel transistor P3, and fourth P channel transistor P4 of the first current mirror circuit and the second P channel transistor P2, fifth P channel transistor P5, and sixth P channel transistor P6 of the second current mirror circuit. The second output current becomes higher than the first output current due to the contributions of the fourth P channel transistor P4 and sixth P channel transistor P6, the actions of which are unavailable during the generation of the first output current. Thus, in a case where multiple transistors are used for generating a constant current (i.e., where the constant current is spread among several transistors), the cut-off frequency range can be broadened without affecting the constant current attribute of the transistor (i.e., without losing the constant current region attributed to the impression of a high source-drain voltage (Vds) on a specified transistor).

There are no restrictions on the switch control circuit so long as it is a circuit capable of providing the control signals shown in FIG. 10.2. Examples of switch control circuits are shown in FIGS. 11, 12, and 13.

Figure 11:
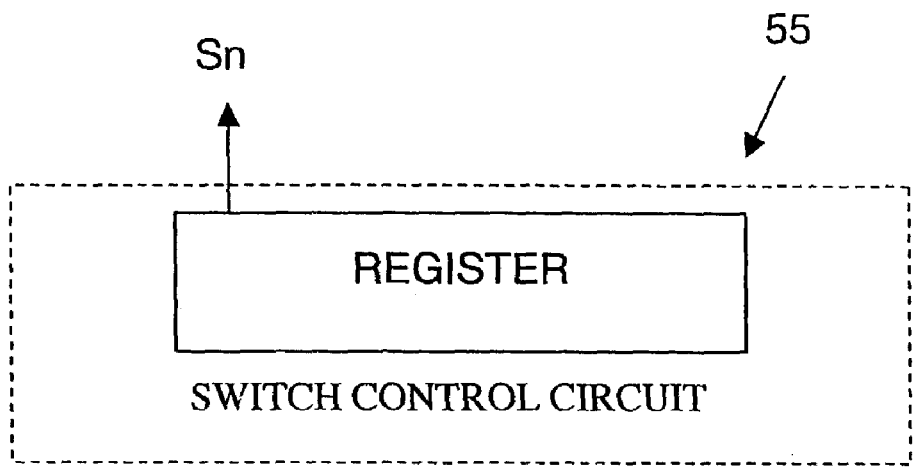
FIG. 11 shows a first example of a switch control circuit.

The switch control circuit 55 shown in FIG. 11 is formed by register 56. The contents stored in the register 56 are output as the control signal Sn for controlling the switch circuit. The contents of the register 56 can be rewritten by a special interface.

Figure 12:
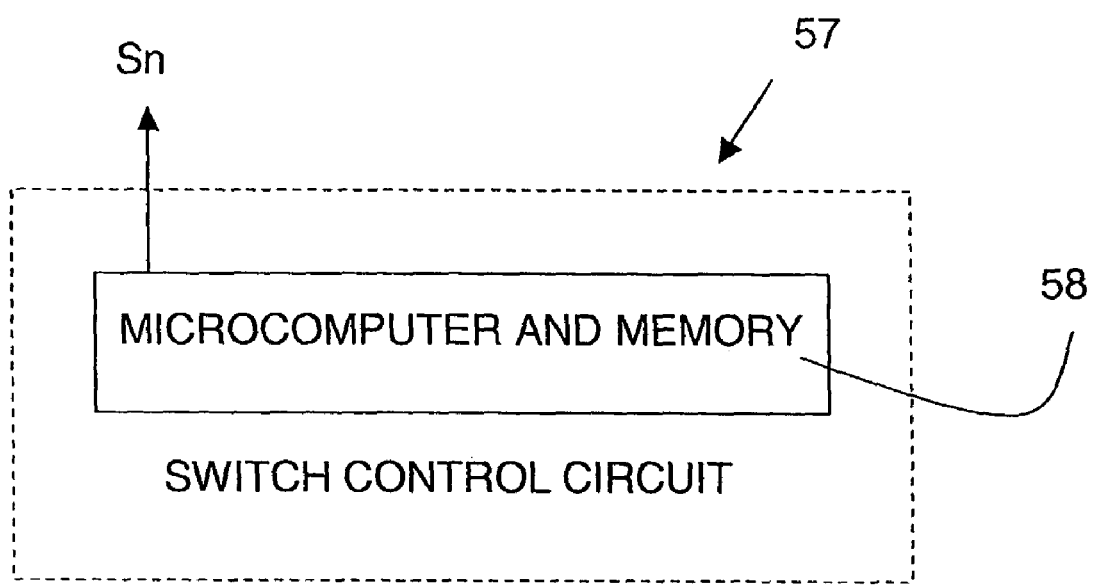
FIG. 12 shows a second example of a switch control circuit.

The switch control circuit 57 shown in FIG. 12 is formed by a microcomputer and a memory 58. The contents stored in the memory are output as the control signal Sn under the control of the microcomputer. The signal Sn output is based on the switch circuit controlled.

Figure 13:
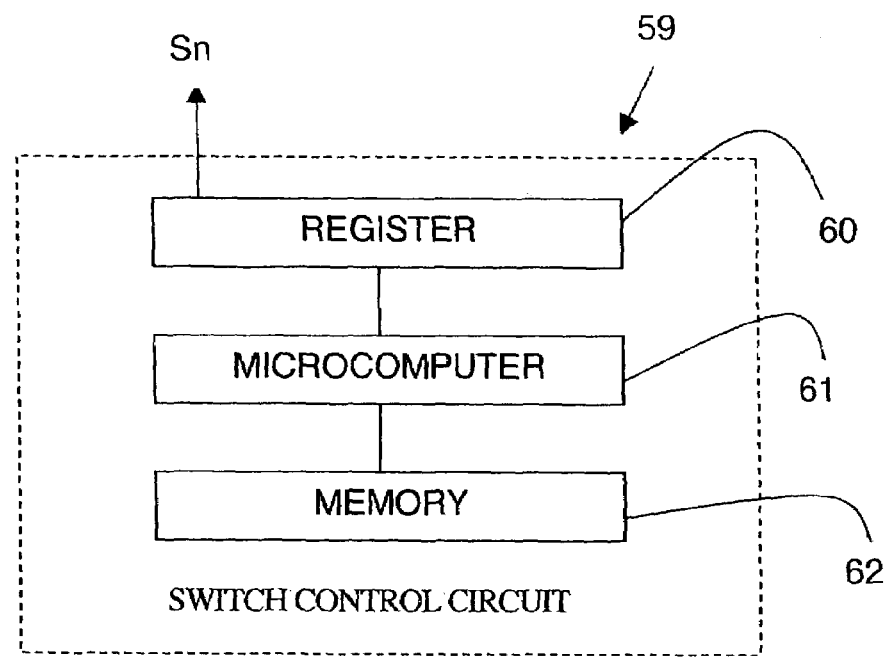
FIG. 13 shows a third example of a switch control circuit.

The switch control circuit 59 shown in FIG. 13 is formed by the register 60, microcomputer 61, and memory 62. The contents stored in the memory become temporarily stored in the register under the control of said microcomputer. The contents stored in the register are output as the control signal Sn. The signal Sn output is also based on the switch circuit controlled.

The switch control procedures described above in the context of designating the cut-off frequency in FIG. 9 can be summarized as follows.

When the cut-off frequency is designated at the standard cut-off frequency available by default (current mirror ratio: 1:1). The first switch SW1 and second switch SW2 of the first current mirror circuit are turned ON. The third switch SW3 and fourth switch SW2 of the first current mirror circuit are turned OFF. The fifth switch SW5 and sixth switch SW6 of the second current mirror circuit are turned ON. And the seventh switch SW7 and eighth switch SW8 of the second current mirror circuit are turned OFF. These settings correspond to the switch state shown in FIG. 9.

When the cut-off frequency is designated at double the standard cut-off frequency available by default (current mirror ratio: 1:2). The first switch SW1 and second switch SW2 of the first current mirror circuit are turned ON. The third switch SW3 and fourth switch SW2 of the first current mirror circuit are turned ON. The fifth switch SW5 and sixth switch SW6 of the second current mirror circuit are turned ON. And the seventh switch SW7 and eighth switch SW8 of the second current mirror circuit are turned ON.

Thus, as far as the first application example of the present invention is concerned, the current mirror ratio is changed by switching on or off transistors operating in the constant current region using control signals. A gm variation is induced based on the level of the current that varies in accordance with the change in the current mirror ratio, based on which the cut-off frequency is rendered variable. The variation range is determined by the number n (n is an integer) of switch sets, P channel transistors, and constant current sources configured in relation to the first current mirror circuit and the second current mirror circuit. In other words, where the number of sets thereby configured in relation to the first current mirror circuit and the second current mirror circuit is n, a cut-off frequency n times the standard cut-off frequency can be obtained. The control signals in FIGS. 10.1, 11, 12, and 13 are expressed by Sn for signifying the attainability of n times the standard cut-off frequency while indicating the indispensability of the specified number (n) of control signals for achieving n times the standard cut-off frequency. The number of sets of switches, P channel transistors, and constant current sources is 2 in the first application example of the present invention, and the range of the cut-off frequency variation is double (1:2).

As shown above, a cut-off frequency gain can be changed by a factor of n. When a constant current source is used as the first current source PS1 shown in FIG. 9, the variation of the cut-off frequency is a stepwise variation. When a variable current source is used, the variation of the cut-off frequency becomes an analog (non-stepwise) variation. Where the value of the first current source PS1 is set at 2 mA (i.e., where a constant current source is used), for example, the output current becomes 1 mA with regard to the aforementioned switch control modality of 1:1. The output current becomes 2 mA with regard to the aforementioned switch control modality of 1:2. As the n value increases, furthermore, the output current may accordingly increases to 3 mA, 4 mA, . . . , but in such a case, only crude adjustments are rendered by units of integer multiples of 1 mA, and fine adjustments in increments of less than 1 mA are impossible. In a case where the first current source is rendered variable (e.g., where the current value is rendered variable over a range of 0.5 mA~1 mA), output currents over a range of 0.5 mA~1 mA can be obtained in an analog fashion with regard to the switch control modality of 1:1, whereas output currents over a range of 1 mA~2 mA can be obtained in an analog fashion with regard to the switch control modality of 1:2. Thus, in a case where a variable current source is used as the first current source, the output current can be adjusted by a unit smaller than 1 mA.

The gm filter circuit 50 in the first example of the present invention changes the cut-off frequency to a higher value by means of a gm gain based on the change in the current mirror ratio. In contrast, the gm filter circuit 60 in the second example of the present invention changes the cut-off frequency to a lower value by means of a gm loss based on the change in the current mirror ratio. The gm filter circuit 60 shown in FIG. 14 is capable of changing the standard cut-off frequency available by default to ½ its default level.

Figure 14:
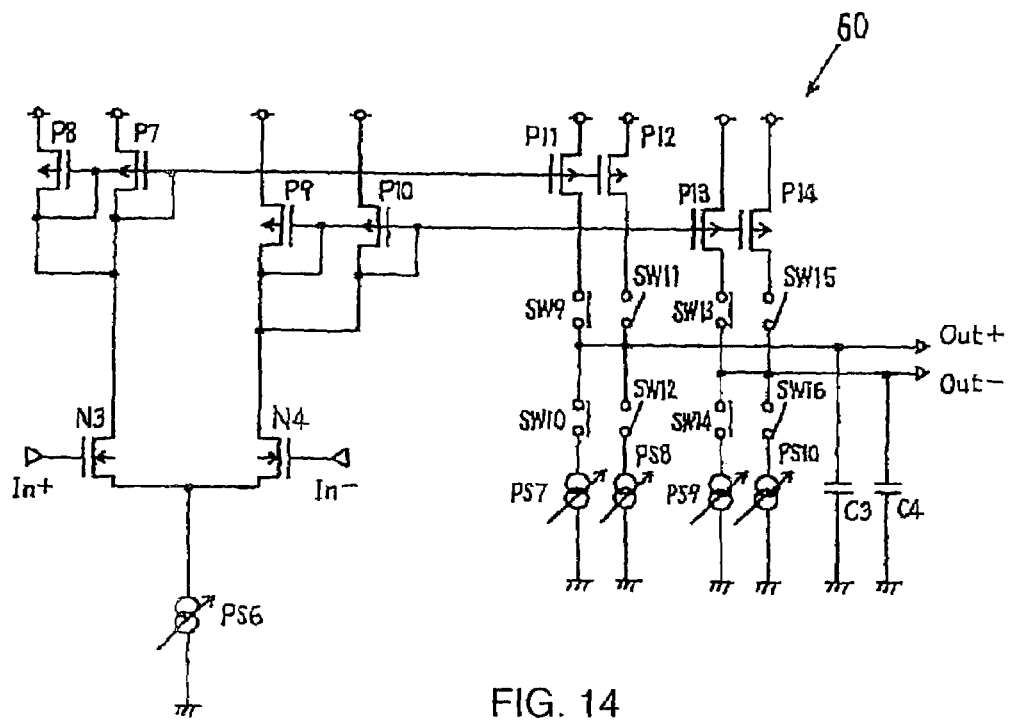
FIG. 14 shows a second example of the present invention.

FIG. 14 shows a second example of the present invention. The gm filter circuit 60 shown in this figure includes a differential input unit formed from a third N channel transistor N3 and fourth N channel transistor N4, into which differential input signals are fed. A third constant current circuit is formed by a current mirror circuit and responds to the first differential input signal. A fourth constant current circuit is formed by a current mirror circuit and corresponds to the second differential input signal constituted by a current mirror circuit. A sixth variable current source (or constant current source) PS6 provides current to the differential input unit. A third capacitor C3 and fourth capacitor C4 are connected to the outputs of the respective mirror circuits. A switch control circuit (not shown in the figure) controls the mirror ratios for the mirror currents.

In the gm filter circuit 50 of the first example of the present invention, the number of P channel transistors connected to the drains of the respective N channel transistors which receive the first differential input signal or second differential input signal is one each. In contrast, in the gm filter circuit 60 of the second example of the present invention, the number of P channel transistors connected to the drains of the respective N channel transistors which receive the first differential input signal or second differential input signal is two each. In other words, the number of P channel transistors connected to the third N channel transistor N3, which receives the first differential input signal, is two, namely the seventh P channel transistor P7 and eighth P channel transistor P8. And the number of P channel transistors connected to the fourth N channel transistor N4, which receives the second differential input signal, is two, namely the ninth P channel transistor P9 and tenth P channel transistor P10.

The cut-off frequency is designated according to the following switch control procedures. When the cut-off frequency is the standard cut-off frequency available by default (current mirror ratio: 1:1), the seventh P channel transistor P7 and the eighth P channel transistor P8 of the third current mirror circuit are turned ON. The ninth P channel transistor P9 and tenth P channel transistor P10 of the third current mirror circuit are turned ON. The eleventh P channel transistor P11 and twelfth P channel transistor P12 of the third current mirror circuit are turned ON. The thirteenth P channel transistor P13 and fourteenth P channel transistor P14 of the fourth current mirror circuit are turned ON. The fifteenth P channel transistor P15 and sixteenth P channel transistor P16 of the fourth current mirror circuit are turned ON.

When the cut-off frequency is designated at one-half the standard cut-off frequency available by default (current mirror ratio: 2:1), the seventh P channel transistor P7 and the eighth P channel transistor P8 of the third current mirror circuit are turned ON. The ninth P channel transistor P9 and tenth P channel transistor P10 of the third current mirror circuit are turned ON. The eleventh P channel transistor P11 and twelfth P channel transistor P12 of the third current mirror circuit are turned ON and OFF, respectively. And the thirteenth P channel transistor P13 and fourteenth P channel transistor P14 of the fourth current mirror circuit are turned ON and OFF, respectively.

Thus, as far as the second application example of the present invention is concerned, the current magnitude variation is mitigated by changing the current mirror ratio while a gm reduction is induced. Thus, the cut-off frequency is rendered variable toward the lower side. The range of variation is determined by the number of P channel transistors connected to the sources of the N channel transistors in relation to the number of P channel transistors forming the third current mirror circuit and fourth current mirror circuit. The number of P channel transistors connected to the sources of N channel transistors is two in the second application example of the present invention, and accordingly, the variation range of the cut-off frequency is one-half. The variation range of the cut-off frequency can be changed to other fractionalized multiples by increasing the number of P channel transistors.

Figure 15:
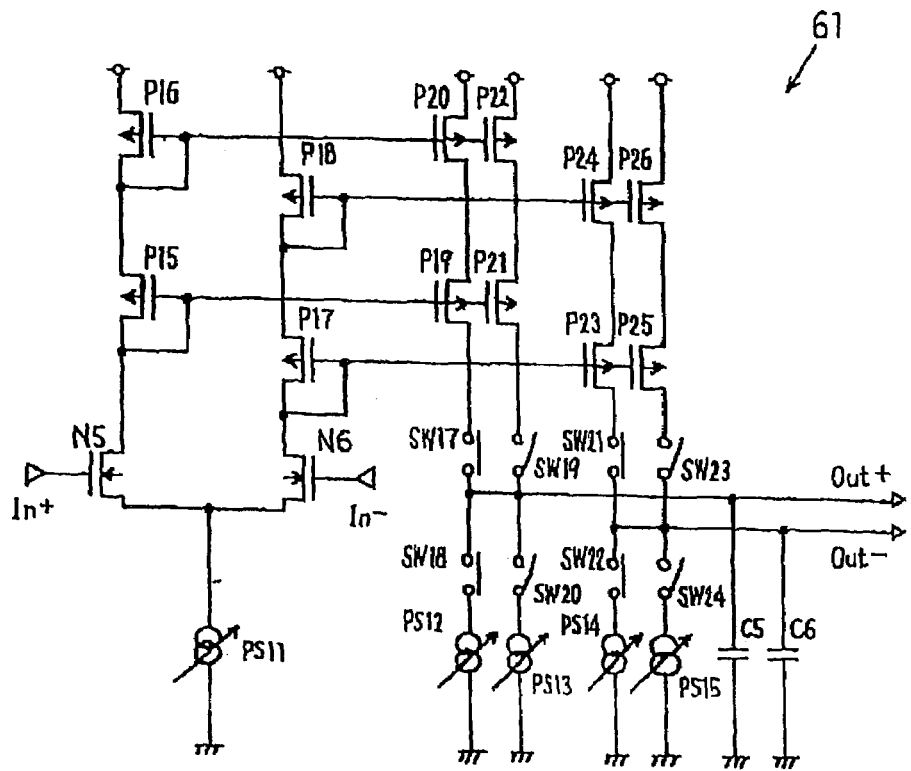
FIG. 15 which shows a third example of the present invention.

FIG. 15 shows a third example of the present invention. The gm filter circuit 61 in the third example of the present invention represents an attempt to improve the constant current feature in comparison to the gm filter circuit 50 of the first example of the present invention.

In the third example of the present invention, the P channel transistors P16, P18, P20, P22, P24, and P26 are stacked vertically in relation to the gm filter circuit 50 of the first example of the present invention.

Figure 16:
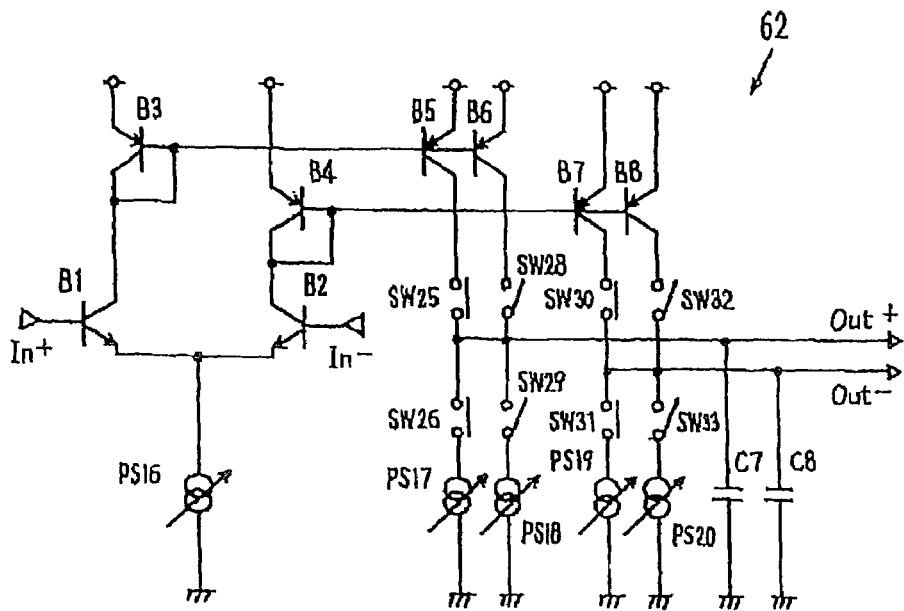
FIG. 16 shows a fourth example of the present invention.

FIG. 16 shows a fourth example of the present invention. The gm filter circuit 62 in the fourth example of the present invention represents an attempt to upgrade the speed of the gm filter circuit 50 of the first example of the present invention.

In the fourth example of the present invention, the MOS transistors of the gm filter circuit 50 of the first application example of the present invention are substituted with bipolar transistors. In other words, the first N channel transistor N1, second N channel transistor N2, first P channel transistor P1, second P channel transistor P2, third P channel transistor P3, fourth P channel transistor P4, fifth P channel transistor P5, and sixth P channel transistor P6 are substituted respectively with the first bipolar transistor B1, second bipolar transistor B2, third bipolar transistor B3, fourth bipolar transistor B4, fifth bipolar transistor B5, sixth bipolar transistor B6, seventh bipolar transistor B7, and eighth bipolar transistor B8.

Figure 17:
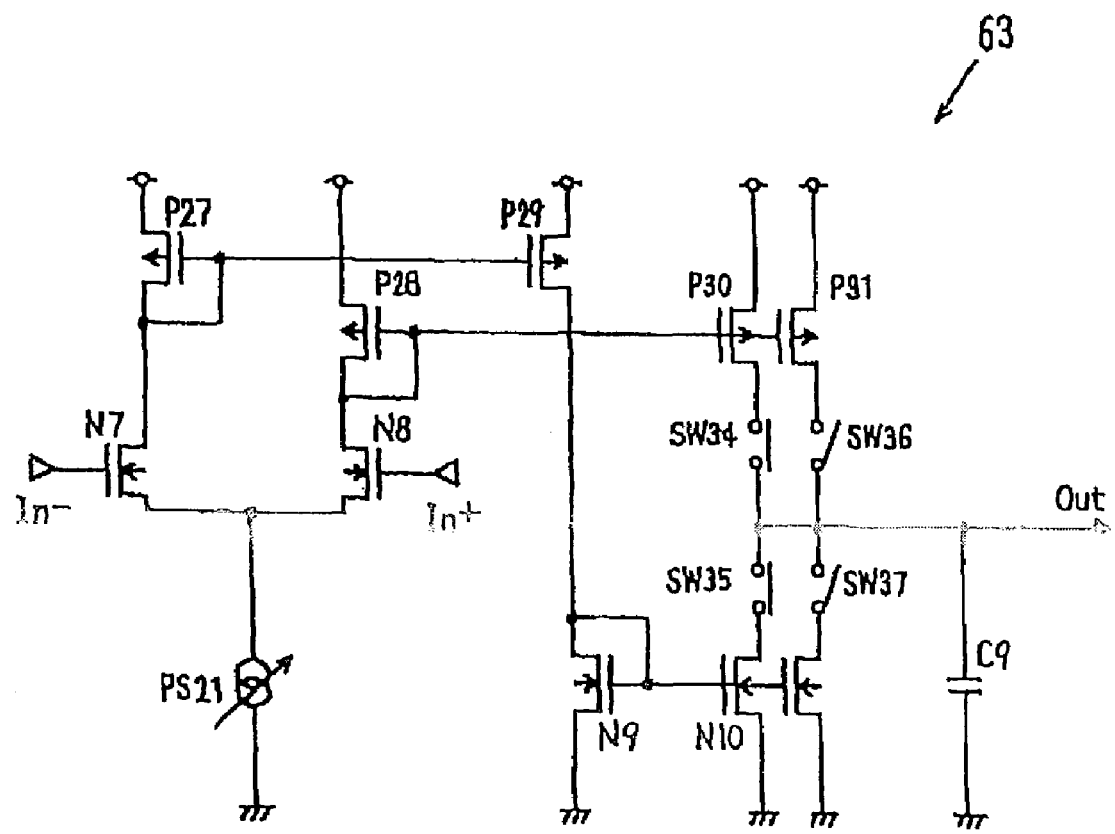
FIG. 17 shows a fifth example of the present invention.

FIG. 17 shows a fifth example of the present invention. The gm filter circuit 63 in the fifth example of the present invention is an attempt to broaden the range over which the gm filter circuit can be provided, namely the gm filter circuit utility range, by providing a single output signal in relation to the gm filter circuit 50 of the first example of the present invention. The gm filter circuit 50 of the first example of the present invention outputs a differential output signal. A simple circuit which does not handle differential signals, however, may be connected with the gm filter circuit. For this reason, the single output signal is provided in the fifth example of the present invention.

The following effects can be achieved in the present invention:

(1): The variable range of the cut-off frequency can be broadened;

(2): An amplitude reduction of the output voltage can be avoided;

(3): Advantages of the differential circuit such as its advanced power source variation and noise resistance can be exploited.

Based on the aforementioned effects, the inventions of the present application are capable of providing a compatible AV product endowed with both high-frequency DVD and low-frequency CD options. A forty times filter for CD-ROM read channels, etc. can, furthermore, be realized with ease.

What is claimed is:

1. A trans-conductance amplification circuit comprising:
a differential signal input unit comprising a pair of differential input transistors having two outputs;
a first current mirror circuit receiving both outputs from the differential signal input unit, which switches between a first current mirror ratio and a second current mirror ratio; and
a second current mirror circuit receiving both outputs from the differential signal input unit, which switches between the first current mirror ratio and the second current mirror ratio,
wherein the first current mirror circuit and the second current mirror circuit each includes a variable current source or a constant current source.

2. The trans-conductance amplification circuit according to claim 1, further including a switch control circuit controlling the switching between the first current mirror ratio and the second current mirror ratio.

3. The trans-conductance amplification circuit according to claim 2, wherein the switch control circuit includes at least one member selected from among registers, microcomputers, and memories.

4. The trans-conductance amplification circuit according to claim 1, wherein vertically stacked transistors are connected to the first trans-conductance amplification circuit and the second current mirror circuit.

5. A trans-conductance filter circuit including the trans-conductance amplification circuit according to claim 1.

6. A trans-conductance amplification circuit comprising:
a differential signal input unit comprising a pair of differential input transistors having two outputs;
a first current mirror circuit receiving both outputs from the differential signal input unit; and
a second current mirror circuit receiving both outputs from the differential signal input unit, wherein
at least one of the first current mirror circuit and the second current mirror circuit comprise a switch circuit and wherein the switch circuit switches between a first output current and a second output current,
wherein the first current mirror circuit and the second current mirror circuit each includes a constant current source or a variable current source.

7. The trans-conductance amplification circuit according to claim 6, further including a switch control circuit which controls the switch circuit.

8. The trans-conductance amplification circuit according to claim 7, wherein the switch control circuit includes at least one member selected from among registers, microcomputers, and memories.

9. The trans-conductance amplification circuit according to claim 6, wherein vertically stacked transistors are connected to the first current mirror circuit and the aforementioned second current mirror circuit.

10. The trans-conductance amplification circuit according to claim 6, including one or two output terminals.

11. A trans-conductance filter circuit including the trans-conductance amplification circuit according to claim 6.

12. A trans-conductance amplification circuit comprising a differential signal input unit comprising a pair of differential input transistors having two outputs;
a first switch circuit receiving both outputs from the differential signal input unit, which triggers a first transistor within a constant current region based on a first control signal; and
a second switch circuit receiving both outputs from the differential signal input unit, which triggers the first transistor and a second transistor within a constant current region based on a second control signal.

13. The trans-conductance amplification circuit according to claim 12, further including a switch control circuit which controls the first switch circuit and the second switch circuit.

14. The trans-conductance amplification circuit according to claim 12, wherein the switch control circuit includes at least one member selected from among registers, microcomputers, and memories.

15. The trans-conductance amplification circuit according to claim 12, wherein the first trans-conductance amplification circuit and the second current mirror circuit each include constant current sources or variable current sources.

16. A trans-conductance filter circuit including the trans-conductance amplification circuit according to claim 12.

17. A trans-conductance amplification circuit comprising:
a signal input unit comprising a pair of differential input transistors having two outputs;
a current mirror circuit receiving both outputs from the signal input unit, which switches between a first output current and a second output current; and
a control circuit which controls the mirror circuit,
wherein the current mirror circuit includes a constant current source or a variable current source.

18. The trans-conductance amplification circuit according to claim 17, wherein the switch control circuit includes at least one member selected from among registers, microcomputers, and memories.

19. The trans-conductance amplification circuit according to claim 17, wherein vertically stacked transistor are connected to the current mirror circuit.

20. The trans-conductance amplification circuit according to claim 17, including one or two output terminals.

21. A trans-conductance filter circuit including the trans-conductance amplification circuit according to claim 17.

22. A trans-conductance amplification circuit comprising:
a signal input unit comprising a pair of differential input transistors having two outputs; and
a current mirror circuit receiving both outputs from the signal input unit, wherein
the current mirror circuit comprises a switch circuit which is controlled based on a first control signal or second control signal and selectively outputs a first output current or second output current based on the action of the switch circuit,
wherein the current mirror circuit includes a constant current source or a variable current source.

23. The trans-conductance amplification circuit according to claim 22, including a switch control circuit which controls the switch circuit.

24. The trans-conductance amplification circuit according to claim 23, wherein the switch control circuit includes at least one member selected from among registers, microcomputers, and memories.

25. The trans-conductance amplification circuit according to claim 22, wherein vertical stacked transistors are connected to the current mirror circuit.

26. The trans-conductance amplification circuit according to claim 22, wherein the current mirror circuit possesses one or two output terminals.

27. A trans-conductance filter circuit including the trans-conductance amplification circuit according to claim 22.

28. A trans-conductance amplification circuit comprising:
a differential signal input unit comprising a pair of differential input transistors having two outputs; and
a number n (n is a positive integer) of current mirror circuits receiving both outputs from the differential signal input unit and select the corresponding mutually different current mirror ratios,
wherein each of the current mirror circuits includes a constant current source or a variable current source.

29. A trans-conductance amplification circuit according to claim 28, wherein at least one of current mirror circuits includes multiple switch circuits for outputting mutually different output currents.

30. A trans-conductance amplification circuit comprising:
a signal input unit comprising a pair of differential input transistors having two outputs;
a number n (n is a positive integer) of current mirror circuits receiving both outputs from the differential signal input unit including switch circuits for switching and outputting mutually different output currents; and a switch control circuit which controls the switch circuits,
wherein each of the current mirror circuits includes a constant current source or a variable current source.

31. A trans-conductance amplification circuit comprising:
a signal input unit comprising a pair of differential input transistors having two outputs; and
a number n (n is a positive integer) of current mirror circuits receiving both outputs from the differential signal input unit;

wherein each of circuits has a switch circuit which is controlled based on a control signal and selectively output multiple mutually different output currents based on the actions of the switch circuits, wherein each of the current mirror circuits includes a constant current source or a variable current source.

* * * * *